United States Patent
Drasny

(10) Patent No.: US 7,280,055 B2
(45) Date of Patent: Oct. 9, 2007

(54) METHOD AND APPARATUS FOR ENCODING BINARY DATA AS A ZERO TERMINATED STRING

(75) Inventor: Gabor Drasny, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 190 days.

(21) Appl. No.: 11/112,776

(22) Filed: Apr. 22, 2005

(65) Prior Publication Data

US 2007/0052563 A1    Mar. 8, 2007

(51) Int. Cl.
*H03M 7/46* (2006.01)
(52) U.S. Cl. .......................... 341/63; 341/50
(58) Field of Classification Search .......... 341/50, 341/51, 83; 382/232; 708/530
See application file for complete search history.

(56) References Cited

U.S. PATENT DOCUMENTS

| | | | |
|---|---|---|---|
| 4,566,038 A * | 1/1986 | Dimick | 382/245 |
| 6,244,762 B1 * | 6/2001 | Fukano et al. | 400/70 |
| 6,549,949 B1 | 4/2003 | Bowman-Amuah | 709/236 |

* cited by examiner

*Primary Examiner*—Brian Young
(74) *Attorney, Agent, or Firm*—Lynn L. Augspurger; Richard M. Goldman

(57) ABSTRACT

Passing input strings through an application programming interface between functions that take null byte terminated strings as arguments, where at least some of said input strings contain null bytes internally. This is accomplished by storing the positions of the null bytes relative to the start of the block and storing the non-null bytes in their relative order to prevent said internal null strings from being treated as terminal null strings.

12 Claims, 3 Drawing Sheets

METHOD AND APPARATUS FOR ENCODING BINARY DATA AS A ZERO TERMINATED STRING

SUMMARY OF THE INVENTION

1. Field of the Invention

Figure 1:
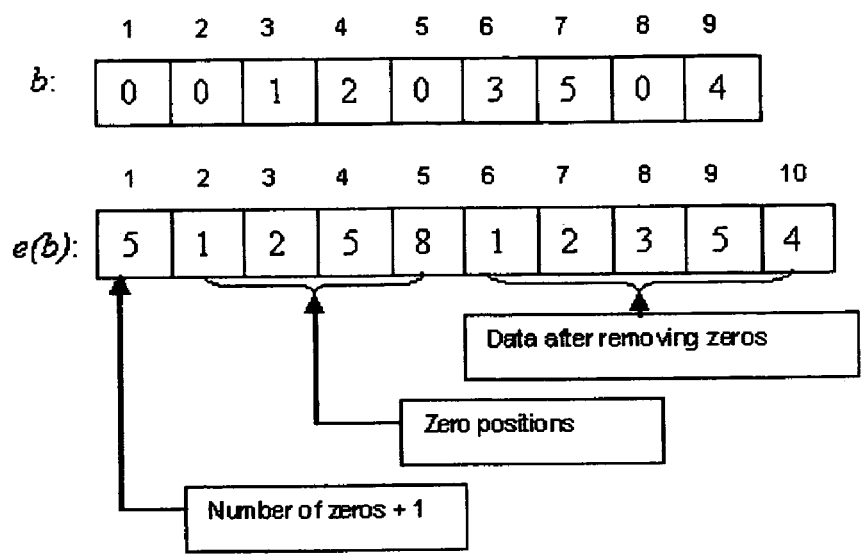

The present invention relates to data stream patterns and code patterns and more particularly to stream based patterns which employ localized addressing of selected bytes within the data stream or code stream pattern

2. Background

In certain applications an inadvertent concatenation of data stream segments can result in a misinterpretation of the contained data. One such situation is an application programming interface (API) that has functions that take zero terminated strings as arguments to store and retrieve these strings. Sometimes it becomes necessary to pass binary data streams to these functions, which data streams may contain zero value characters as data elements inside the data stream. This makes it impossible for the API functions to know how long the data segment actually is, treating each string of zero valued characters as a data string termination.

One suggested solution is to change the API functions to take an extra length parameter. But most of the time modifying the API code is not an option since code and the modification to the code might be not under the control of the programmer who uses the API or is unfeasible for other reasons.

Another suggested solution is to use the API functions, include the API code, unchanged, but encode all binary data first to a zero terminated string that can be stored by an API function and later when the encoded string is retrieved the original data can be restored using a decoder function. The difficulty with this proposed solution is to find suitable encode/decode algorithms that are computationally inexpensive and increase the size of the encoded data by only a negligible overhead.

There are currently existing algorithms that provide an encoding/decoding function pair between byte strings and sequences of non-null bytes. These have been suggested to be used with the trivial modification to in order to convert byte strings to zero terminated strings and later restore the original byte string.

These algorithms include: uuencode/uudecode, xxencode/xxdecode, BinHex, Base64 and yEnc. They are usually used for converting files that can be transmitted using 6 or 7 bit networks (e.g. as e-mail attachments). The first four of these algorithms converts byte strings into sequences of bytes that are all codes of printable ASCII characters. The yEnc encoding algorithm converts byte strings into sequences of bytes that none of the bytes has the value of 0, 10, or 13. All of these algorithms then split up the data into lines of bounded length by inserting bytes that represent new line characters into the sequence of bytes.

The problem of using these methods is that they were created for a different purpose than our goal is, and they increase of the length of the byte sequences significantly during encoding.

The typical overhead for uuencode, xxencode, BinHex and Base64 is 33%-40% as they usually replace 3 bytes with 4 printable ASCII characters (which results in a 4/3 increase in the length of the encoded sequences), and inserting new line codes periodically and some of them also store the length of each line in some way.

The yEnc encoding has a much smaller overhead, typically around 1.6%. However, this overhead is not fixed, if certain bytes (namely 19, 214, 224, 227) occur in greater frequency in the input sequence, the overhead can increase. In the worst case scenario, when the whole sequence consists of these four bytes, the overhead is 100%.

The theoretically optimal encoding method, which increases the length of the encoded sequences by the smallest amount, is to interpret a given byte sequence as a base 256 number and convert it to a base 255 number and create a byte sequence from it by adding 1 to each digit. This has an overhead factor of $$(\log(256)/\log(255))-1 \approx 0.07\%$$

However, this conversion requires computationally extremely expensive calculations even if the sequence to be encoded was broken up into smaller sub-sequences and then encoded piecewise.

Thus, it is necessary to find a solution that provides such an encode/decode algorithms that satisfy these conditions and makes it possible to calculate the size of the encoded or decoded data easily based on only the size of the data that is do be encoded or decoded.

SUMMARY OF INVENTION

The encoding method described herein works by splitting up the input sequence of bytes into 255 byte long blocks, possibly leaving a tail block that is shorter than 255 bytes long. Each block (including the tail block) is then processed separately by storing the number of null bytes in the block increased by 1, then storing the positions of the null bytes relative to the start of the block and then storing all the non-null bytes in their relative order. Thus the size of each block is increased by exactly 1 byte. The end result is the concatenation of the processed blocks followed by a terminating null byte.

This method is computationally very easily executed and has a fixed overhead of around $$((256/255)-1) \approx 0.39\%,$$

or more precisely, if the length of the input sequence N then the length of the encoded sequence (not including the terminating null byte) is $$l_e(N) = \begin{cases} N/255 * 256 & \text{if } N \text{ is divisible by 255,} \\ [N/255] * 256 + (N \bmod 255) + 1 & \text{otherwise.} \end{cases}$$

Similarly, when decoding the length of the decoded sequence is given by:

$$l_d(N) = \begin{cases} N/256 * 255 & \text{if } N \text{ is divisible by 256,} \\ [N/256] * 255 + (N \bmod 256) - 1 & \text{otherwise.} \end{cases}$$

FIGURES

Various aspects of the method, system, and program product of our invention are illustrated in the FIGURES appended hereto.

FIG. 1 is a tabular representation of an input string, b, and an output string, e(b), showing blocks for the number of zeros plus one, the zero positions, and the data after removing the zeros.

Figure 2:
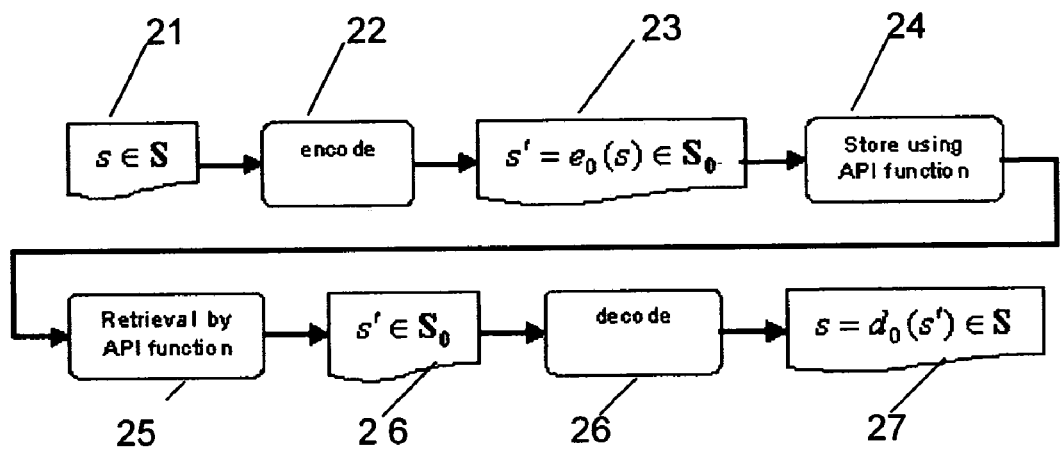
Figure 3:
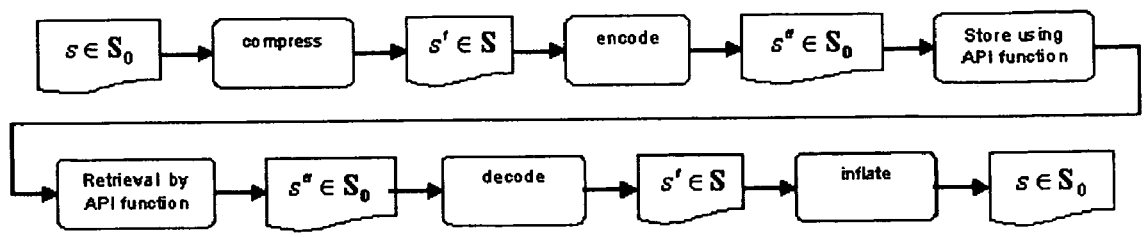
Figure 4:
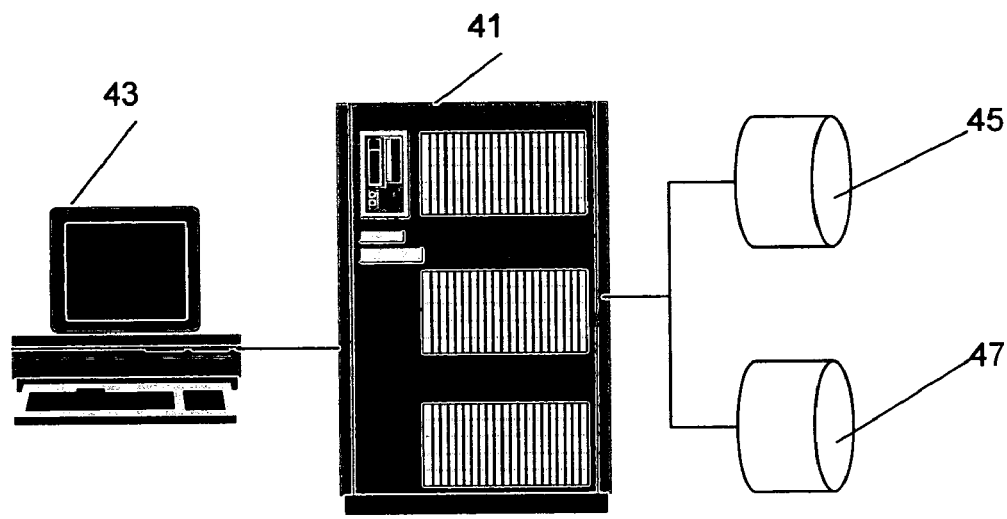

FIG. 2 is a flow chart showing storage of arbitrary byte sequences using a function that expects a zero terminated byte sequence as an input, passing the encoded value of the original data to the function instead, and then, when another, subsequent, function retrieves this zero terminated string, the string is decoded back to the original data. S denotes the set of byte strings (i.e. finite sequences of bytes) and S0 the set of null terminated byte strings (i.e. finite sequences of non-null bytes followed by a null byte), e0 and d0 the encoding and decoding functions, respectively FIG. 3 is a flow chart showing storing and retrieving very long zero terminated strings, where the amount of memory or storage needed is reduced by compressing the strings, encoding the compressed data into a zero terminated string and storing that string instead of the original one. Also shown is retrieval decoding the retrieved zero terminated string and then decompressing it into the original zero terminated string, FIG. 4 illustrates a system for carrying out the method of the invention, including a terminal, a processor, and storage for data and system and application code.

Figure 5:
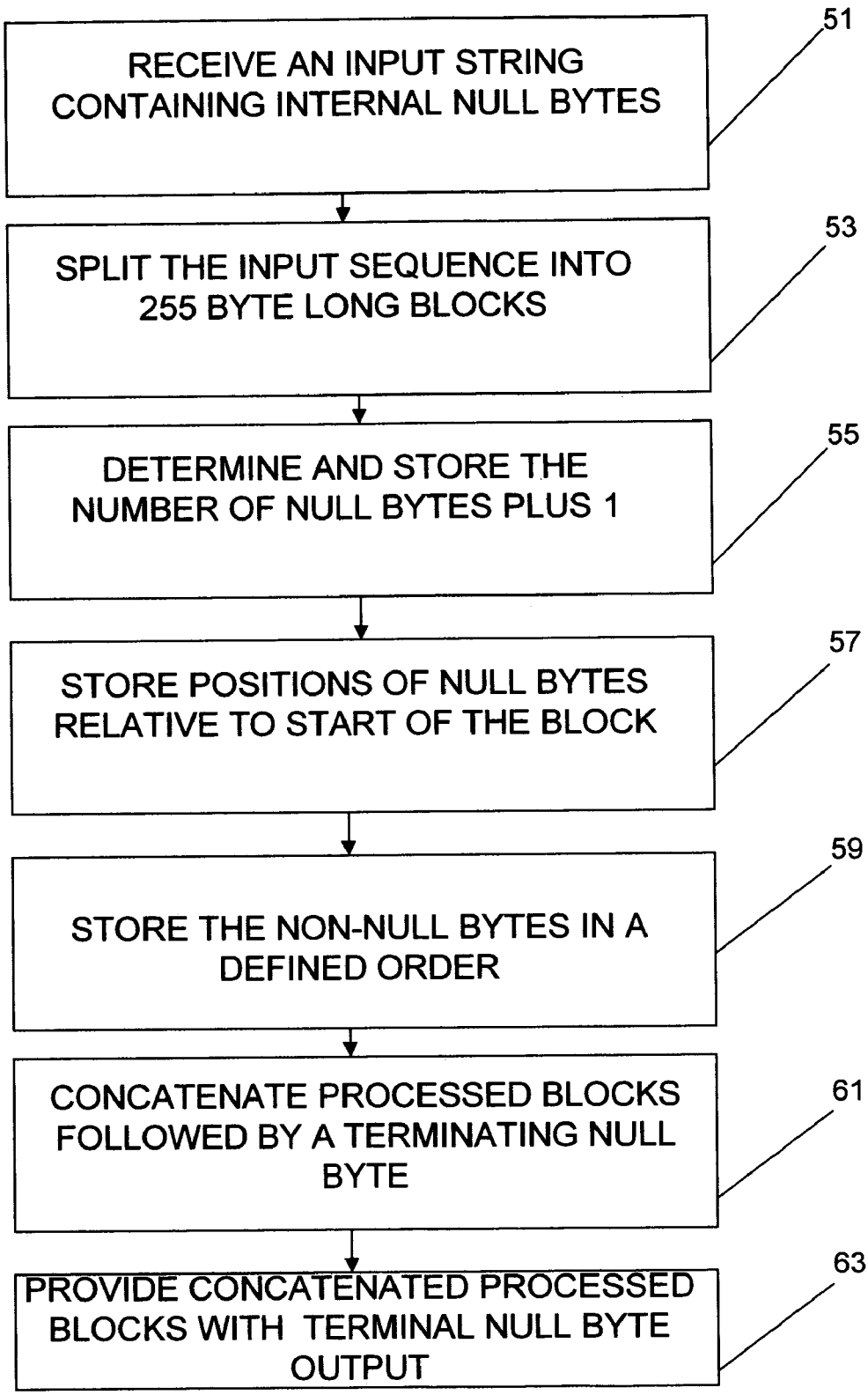

FIG. 5 illustrates a flow chart for carrying out a method of the invention.

DETAILED DESCRIPTION

According to the invention described herein there is provided a method of passing arbitrary byte sequences between functions, where the said functions can handle only zero terminated string not containing internal null bytes. The method described herein prevents the internal null bytes in the data being treated as terminal bytes (thus truncating the data) by storing the positions of the string. The method described herein prevents the internal null strings from being treated as terminal null strings by storing the positions of the null bytes relative to the start of the block and storing the non-null bytes in a defined order, either in their relative order, or in reverse of their original relative order.

This is illustrated in FIG. 1 which shows the original string, b, with nine segments including four zeros, and the output string with ten segments. The first segment is the number of zeros plus 1. This is shown as "5". Next are the positions of the zeros, shown here in their original relative order, and last are the remaining non-zeros.

FIG. 4 illustrates a typical computer system 40 for carrying out the invention described herein. The computer system includes a terminal 43 for user input, a processor 41 (as a server), and storage, including data storage 45 and program storage 47 for system software and application software. The program code, including suitable application program interfaces, causes the computer system to carry out, among other tasks, a method of passing null byte terminated input strings between functions. These functions take byte strings as arguments, and at least some of these strings may contain null bytes internally. The software stores the positions of the null bytes relative to the start of the block and stores the non-null bytes in a defined order which may be either their relative order or the reverse of their relative order to prevent the internal null bytes from being treated as terminal null strings.

The method of the invention provides for passing arbitrary input strings through an application programming interface between functions where the functions takes strings, such as null byte terminated strings, as arguments. At least some of the input strings contain null bytes internally. FIG. 5 is a flow chart illustrating as method of the invention. As shown in FIG. 5, the first step is to receive 51 and split the input sequence 53 into 255 byte long blocks. Next the number of null bytes plus 1 is determined and stored 55. The method of the invention then stores the positions of the null bytes relative to the start of the block 57 and stores the non-null bytes in a defined order 59 which may be their relative order or their reverse relative order. Next the method concatenates the processed blocks 61 followed by a terminating null byte and provides as an output the concatenated processed blocks with internal null bytes stored positions of the null bytes relative to the start of the block, and a terminal null byte 63.

As shown in FIG. 2, the input sequence 21 is decomposed into 255 byte long blocks: $s=s_1 s_2 s_n$, where length $(s_i)=255$ for $i=1, 2, \ldots n-1$ and length$(s_n)\cdot 255$. Each block is encoded 22 the following way: If the input block $b=s_j$ has k null bytes in it on positions $p_1<p_2<\ldots<p_k$ (that is if b is a sequence of N·255 bytes: $b=(b(1), b(2), \ldots, b(N))$, then for all $1 \cdot i \cdot k$) and removing all the null bytes from b, the result we get is the $(n_1, n_2, , n_{N-k})=(b(j): j\notin\{p_i: 1\cdot i\cdot k\}$ byte string, then the encoded block shall be $(k+1, p_1, p_2, \ldots, p_k, n_1, n_2, , n_{N-k})$, unless $k=255$, (i.e. b consisted of only 255 null bytes), case the encoded block shall be a 256 long sequence of 255 bytes 25:

$$e(b) = \begin{cases} (k+1, p_1, p_2, \ldots, p_k, n_1, n_2, \ldots, n_{N-k}) & \text{if } k \leq 254, \\ (255, 255, \ldots, 255) \quad (256 \text{ long}) & \text{if } k = 255. \end{cases}$$

This is as shown in FIG. 2.

The decoding algorithm is similar to the encoding one:

First the terminating zero byte is stripped from the input sequence and the remaining sequence is split up into 256 long blocks, with a possible tail block that is at most 255 bytes long.

Each block is decoded separately the following way. The input block is denoted with b and where b (i) denotes the byte on its ith position (starting from 1), so $b=(b(1), b(2), \ldots, b(N))$. The length of the result will be N−1. The method then sets all bytes to 0 first in the result. If $b(1)=b(2)=255$ the process is complete.

If not, the method determines the number of null bytes in the result as $k=b(1)-1$ and copies $b(k+1+i)$ to the ith smallest position that is not listed among $b(2), \ldots, b(k+1)$ where i goes from 1 to N−k−1.

The resulting decoded byte string is the concatenation of the decoded blocks.

Applications

One application of the method described herein and shown in FIG. 3 is to store arbitrary byte sequences using a function that expects a zero terminated byte sequence (string) as an input, pass the encoded value of the original data to the function instead. When later another function retrieves this zero terminated string it can be decoded back to the original data, as shown in FIG. 3.

In FIG. 3 S denotes the set of byte strings (i.e. finite sequences of bytes) and S0 the set of null terminated byte strings (i.e. finite sequences of non-null bytes followed by a null byte), e0 and d0 the encoding and decoding functions, respectively.

When storing and retrieving very long zero terminated strings the amount of memory or storage needed can be reduced by compressing the strings first using any compression algorithm, then encoding the compressed data into a zero terminated string and storing that string instead of the original one. Retrieval works by decoding the retrieved zero terminated string and then decompressing it into the original zero terminated string, as shown in FIG. 3.

All of the above algorithms can be easily modified to apply to wide byte strings. A wide byte is an 8n bit unit of storage (where $n \geq 2$ is a fixed integer) stored on n consecutive bytes. A null wide byte is a wide byte that stores the 0 value (i.e. all of the n bytes holds the value of 0). A wide byte string is a sequence of wide bytes; a zero terminated wide byte string is a sequence of non-null wide bytes followed by a null wide byte. The trivial modifications to the algorithms (e.g. splitting up the sequence to $2^{8n}-1$ long sub-sequences instead of 255 long ones, etc) give efficient encoding/decoding functions between wide byte strings and null terminated wide byte strings. functions between wide byte strings and null terminated wide byte strings.

The invention may be implemented, for example, by having the system and method for passing input strings containing internal null bytes between functions, to prevent the internal null strings from being treated as terminal null strings, as a software product. This is accomplished by executing the method as a software application, in a dedicated processor, or in a dedicated processor with dedicated code. The code executes a sequence of machine-readable instructions, which can also be referred to as code. These instructions may reside in various types of signal-bearing media. In this respect, one aspect of the present invention concerns a program product, comprising a signal-bearing medium or signal-bearing media tangibly embodying a program of machine-readable instructions executable by a digital processing apparatus to perform a method for prevent the internal null strings from being treated as terminal null strings as a software application.

This signal-bearing medium may comprise, for example, memory in a server. The memory in the server may be non-volatile storage, a data disc, or even memory on a vendor server for downloading to a processor for installation. Alternatively, the instructions may be embodied in a signal-bearing medium such as the optical data storage disc. Alternatively, the instructions may be stored on any of a variety of machine-readable data storage mediums or media, which may include, for example, a "hard drive", a RAID array, a RAMAC, a magnetic data storage diskette (such as a floppy disk), magnetic tape, digital optical tape, RAM, ROM, EPROM, EEPROM, flash memory, magneto-optical storage, paper punch cards, or any other suitable signal-bearing media including transmission media such as digital and/or analog communications links, which may be electrical, optical, and/or wireless. As an example, the machine-readable instructions may comprise software object code, compiled from a language such as "C++", Java, Pascal, ADA, assembler, and the like.

Additionally, the program code may, for example, be compressed, encrypted, or both, and may include executable code, script code and wizards for installation, as in Zip code and cab code. As used herein the term machine-readable instructions or code residing in or on signal-bearing media include all of the above means of delivery.

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

I claim:

1. A method of passing input strings between functions, where said functions take null byte terminated strings as arguments, and where at least some of said input strings contain null bytes internally, and storing the positions of the null bytes relative to the start of the block and storing the non-null bytes in a defined relative order to prevent said internal null strings from being treated as terminal null strings, comprising the steps of:
   a) splitting the input sequence into 255 byte long blocks;
   b) determining and storing the number of null bytes plus 1;
   c) storing the positions of the null bytes relative to the start of the block;
   d) storing the non-null bytes in a defined relative order;
   e) concatenating the processed blocks followed by a terminating null byte; and
   f) providing as an output the concatenated processed blocks with a terminal null byte.

2. The method of claim 1 wherein the defined relative order is the original relative order.

3. The method of claim 1 wherein the defined relative order is the reverse of the original relative order.

4. The method of claim 1 comprising passing arbitrary input strings through an application programming interface between functions that take null byte terminated strings as arguments.

5. A program product comprising a storage medium containing computer readable program code for causing a computer to carry out a method of passing input strings between functions, where said functions take null byte terminated strings as arguments, and where at least some of said input strings contain null bytes internally, and storing the positions of the null bytes relative to the start of the block and storing the non-null bytes in their relative order to prevent said internal null strings from being treated as terminal null strings wherein said program code causes a computer to carry out a method comprising the steps of:
   a) splitting the input sequence into 255 byte long blocks;
   b) determining and storing the number of null bytes plus 1;
   c) storing the positions of the null bytes relative to the start of the block;
   d) storing the non-null bytes in a defined relative order;
   e) concatenating the processed blocks followed by a terminating null byte; and
   f) providing as an output the concatenated processed blocks with a terminal null byte.

6. The program product of claim 5 wherein the defined relative order is the original relative order.

7. The program product of claim 5 wherein the defined relative order is the reverse of the original relative order.

8. The program product of claim 5 wherein said program code causes a computer to carry out a method comprising passing arbitrary input strings through an application programming interface between functions that take null byte terminated strings as arguments.

9. A computer system comprising a digital computer having program storage means and data storage means and including program code for causing the computer to carry out a method of passing input strings between functions, where said functions take null byte terminated strings as arguments, and where at least some of said input strings contain null bytes internally, and storing the positions of the null bytes relative to the start of the block and storing the non-null bytes in a defined relative order to prevent said internal null strings from being treated as terminal null strings X wherein said program code causes the computer to carry out a method comprising the steps of:
- a) splitting the input sequence into 255 byte long blocks;
- b) determining and storing the number of null bytes plus 1;
- c) storing the positions of the null bytes relative to the start of the block;
- d) storing the non-null bytes in their defined order;
- e) concatenating the processed blocks followed by a terminating null byte; and
- f) providing as an output the concatenated processed blocks with a terminal null byte.

10. The computer system of claim 9 wherein the defined relative order is the original relative order.

11. The computer system of claim 9 wherein the defined relative order is the reverse of the original relative order.

12. The computer system of claim 9 wherein said program code causes the computer to carry out a method comprising passing null byte terminated input strings through an application programming interface between functions that take null byte terminated strings as arguments.

* * * * *